United States Patent
Schaefer et al.

(10) Patent No.: US 11,100,972 B2
(45) Date of Patent: Aug. 24, 2021

(54) REFRESH RATE CONTROL FOR A MEMORY DEVICE

(71) Applicant: Micron Technology, inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/786,725

(22) Filed: Feb. 10, 2020

(65) Prior Publication Data
US 2020/0258565 A1    Aug. 13, 2020

Related U.S. Application Data

(60) Provisional application No. 62/804,469, filed on Feb. 12, 2019.

(51) Int. Cl.
*G11C 11/406* (2006.01)

(52) U.S. Cl.
CPC ... *G11C 11/40611* (2013.01); *G11C 11/40615* (2013.01); *G11C 11/40626* (2013.01); *G11C 2211/4061* (2013.01); *G11C 2211/4068* (2013.01)

(58) Field of Classification Search
None
See application file for complete search history.

(56) References Cited

U.S. PATENT DOCUMENTS

| | | | |
|---|---|---|---|
| 7,233,538 B1 | 6/2007 | Wu et al. | |
| 9,286,956 B2 | 3/2016 | Kang et al. | |
| 2002/0004921 A1* | 1/2002 | Muranaka | G11C 29/42 714/704 |
| 2003/0067824 A1* | 4/2003 | Janzen | G11C 11/40615 365/222 |

(Continued)

FOREIGN PATENT DOCUMENTS

WO    2010078454 A1    8/2010

OTHER PUBLICATIONS

ISA/KR, International Search Report and Written Opinion of the International Searching Authority, Int'l. Appl. No. PCT/US20/17731, dated Jun. 16, 2020, Korean Intellectual Property Office, Seo-gu, Daejeon, Republic of Korea, 11 pgs.

*Primary Examiner* — J. H. Hur
(74) *Attorney, Agent, or Firm* — Holland & Hart LLP

(57) ABSTRACT

Methods, systems, and devices for refresh rate control for a memory device are described. For example, a memory array of a memory device may be refreshed according to a first set of refresh parameters, such as a refresh rate. The memory device may detect an event at the memory device associated with a reduction in data integrity. In some cases, the event may be associated with a temperature of the memory device, a voltage level detected at the memory device, an error event at the memory device, or the like. As a result of detecting the event, the memory device may adapt one or more of the set of refresh parameters, such as increasing the refresh rate for the memory array. In some cases, the memory device may adapt the set of refresh parameters by increasing a quantity of rows of the memory array that are refreshed during a refresh operation, decreasing a periodicity between refresh operations, or both.

14 Claims, 11 Drawing Sheets

(56) References Cited

U.S. PATENT DOCUMENTS

2006/0236027 A1\* 10/2006 Jain ..................... G11C 11/406
                                                    711/106
2009/0238020 A1    9/2009 Mayer et al.
2014/0258786 A1    9/2014 Resnick \* cited by examiner

REFRESH RATE CONTROL FOR A MEMORY DEVICE

CROSS REFERENCE

The present Application for Patent claims the benefit of U.S. Provisional Patent Application No. 62/804,469, by SCHAEFER et al., entitled "REFRESH RATE CONTROL FOR A MEMORY DEVICE," filed Feb. 12, 2019, assigned to the assignee hereof, and expressly incorporated by reference herein.

BACKGROUND

The following relates generally to a memory system, and more specifically to refresh rate control for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., SRAM, DRAM, may lose their stored state over time when disconnected from an external power source.

For some types of memory (e.g., DRAM, other volatile memory), logic states stored by memory cells may be occasionally (e.g., periodically) refreshed. Further, in some cases, the amount of time that stored data may maintain data integrity without refreshing may be related to other parameters of a memory device. Improving memory devices, generally, may include increasing memory cell density, increasing read/write speeds, increasing reliability, increasing data integrity, reducing power consumption, or reducing manufacturing costs, among other metrics.

DETAILED DESCRIPTION

Figure 1:
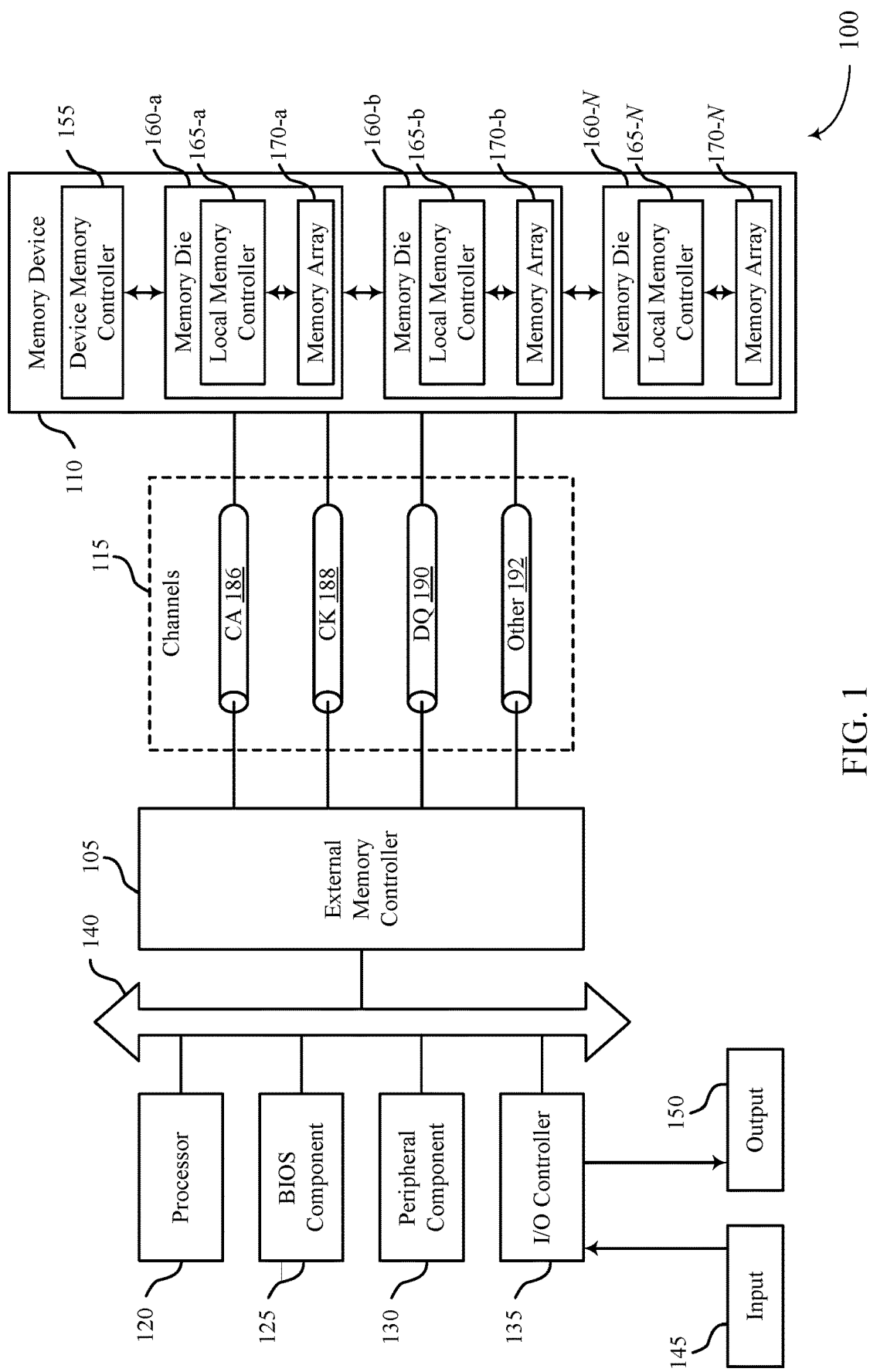
FIG. 1 illustrates an example of a system that that supports that supports refresh rate control for a memory device as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry standards or specifications (e.g., higher reliability constraints).

Some memory cells, such as dynamic memory cells, may exhibit deterioration (loss) of a stored logic state over time. For example, memory cells that utilize a capacitive storage element (e.g., DRAM memory cells) may lose a stored state or have a stored state change to a different state in the event of the capacitive storage element losing some amount of stored charge, such as due to charge leaking from a capacitor. Without intervention, such as refreshing the logic state by rewriting the memory cell (e.g., recharging the capacitive storage element), the logic state stored by the memory cell may be lost or corrupted. One solution is to refresh (rewrite) a memory array every so often (e.g., at periodic intervals), such as by writing to each memory cell in the array to the logic value stored by the memory cell at the time the memory cell is refreshed. The desirable rate of refresh for a memory array may depend on a variety of factors, including deterioration (e.g., leakage) rates of memory cells in the array and reliability criteria or constraints for the array. In some cases, (e.g., automotive applications), increased reliability of the memory array may be desired (e.g., for critical safety functions). Additionally or alternatively, deterioration rates may vary based on one or more operating conditions of the memory array. For example, leakage rates for DRAM memory cells may increase with temperature, and automotive applications may subject the memory array to harsh (e.g., high) temperatures. In another example, leakage rates for DRAM memory cells may increase if voltage conditions for the memory device vary (e.g., a power source voltage is reduced).

Techniques for refresh rate control for a memory device are described. For example, the memory device may detect an event at the memory device that may be associated with a decrease in data integrity. As a result, the memory device may determine to adjust the refresh rate of the memory array to preserve data integrity. The memory device may increase a quantity of rows (e.g., memory cells at one or more physical rows of the memory array) that are refreshed in response to receiving each refresh command from a host device. For example, in order to increase the refresh rate by a factor of two (2), the memory device may double the quantity of rows of the memory array that are refreshed in response to a single refresh command. Additionally or alternatively, the memory device may adjust timing parameters. For example, in order to increase the refresh rate of memory array, the memory device may decrease the periodicity of refresh operations.

Features of the disclosure are further described below in the context of memory systems and a memory device with reference to FIGS. 1-3. Features of the disclosure are then described in the context of process flows with reference to FIGS. 4 through 6. These and other features of the disclosure are further illustrated by and described with reference to apparatus diagrams and flowcharts in FIGS. 7-11 that relate to configurable error correction modes.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input 145, or output 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or a connection to another processor on a printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The data stored at the memory arrays 170 may, in some cases, become corrupted. Corruption of data may refer to an unintentional change of the data and thus may refer to an unintended change in the data that is stored by one or more memory cells (e.g., from a logic one (1) to a logic zero (0), or vice versa). A deviation in the value of a bit from its original and intended value may be referred as an error, a bit error, or a data error. The device memory controller 155 or the local memory controllers 165 may be configured to internally detect and in at least some cases correct (repair) such data corruption or errors and thereby recover the data as intended before corruption. For example, as part of a write operation, the device memory controller 155 or the local memory controllers 165 may generate one or more error detection codewords and store those codewords in an array of memory cells with the data received from a host device. Upon performing a read operation to retrieve the data, the device memory controller 155 or the local memory controllers 165 may also retrieve the error detection codewords and perform error detection or error correction operations to fix certain errors and/or detect certain errors in the data that may have been introduced by the memory device. Such error detection and correction may rely upon error detection information including one or more error-correcting codes (ECCs) (e.g., Hamming codes).

The device memory controller 155 or the local memory controllers 165 may be configured to employ techniques for refresh rate control for memory devices 110. The memory device 110 may refresh each memory array 170, where each of the memory cells within the memory array 170 is refreshed according to a refresh rate. In some cases, device memory controller 155 or the local memory controllers 165 may detect an event (e.g., an extreme temperature, an inadequate voltage supply). The event may be associated with a decrease in data integrity. The device memory controller 155 or the local memory controllers 165 may determine to adjust the refresh rate accordingly (e.g., increase the refresh rate) based on the detected event in order to preserve data integrity.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. In some cases, the external memory controller 105 may be an example of a GPU. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110.

In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
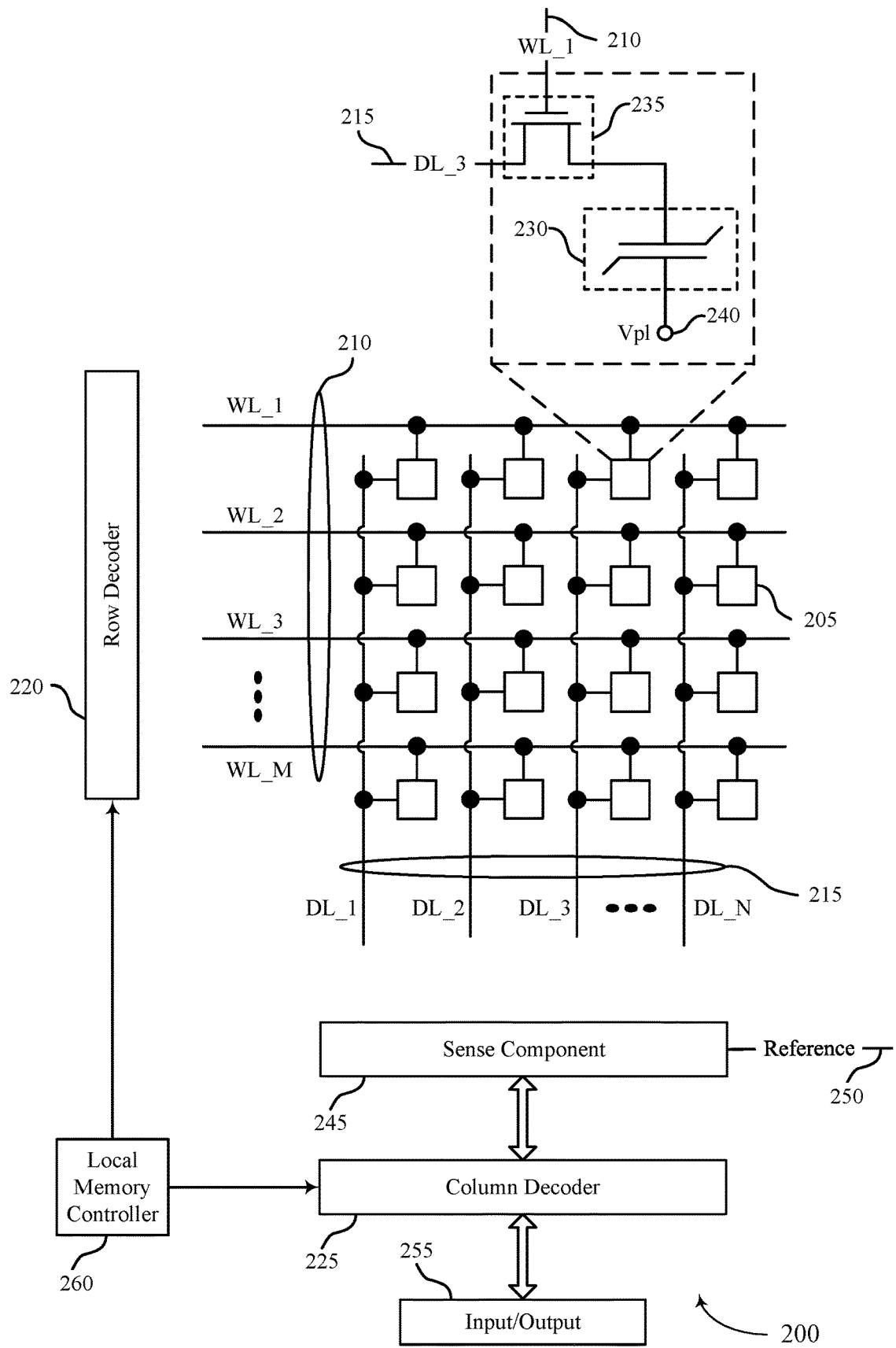
FIG. 2 illustrates an example of a memory die that supports refresh rate control for a memory device as disclosed herein.

FIG. 2 illustrates an example of a memory die 200 in accordance with various examples disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison.

For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260.

The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250.

Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The local memory controller 260 may operate according to either an automatic refresh mode or a self-refresh mode. In an automatic refresh mode, the local memory controller 260 may receive refresh commands for refreshing the memory die 200 from a host device (e.g., from external memory controller 105). The automatic refresh mode may be used in a first operation mode (e.g., a default operation) of the memory device where the memory device receives and executes memory commands. In the automatic refresh mode, the local memory controller 260 may perform a refresh operation when it receives each refresh command, where each refresh operation includes refreshing one or more rows of the memory array.

In a self-refresh mode, the local memory controller 260 may initiate the refresh operations. The self-refresh mode may be used in a low-power or standby state of the memory device, where the memory device may not receive memory commands including refresh commands. In self-refresh mode, the local memory controller 260 may refresh memory cells 205 using an internal oscillator, internal counters, or the like. In either mode, the local memory controller 260 may determine a refresh rate according to the conditions of the memory die 200. The refresh rate may correspond to the inverse of a periodicity that each of the memory cells 205 are refreshed.

The local memory controller 260 may detect an event at the memory device (e.g., an event associated with a decrease in data integrity). As a result, the local memory controller 260 may determine to adjust the refresh rate of the memory die 200 to preserve data integrity. When the local memory controller 260 is operating according to an automatic refresh mode, the local memory controller 260 may increase a quantity of rows (e.g., memory cells at one or more physical rows of the memory die 200) that are refreshed in response to receiving each refresh command from a host device.

For example, in order to increase the refresh rate by a factor of two (2), the local memory controller 260 may double the quantity of rows of the memory die 200 that are refreshed in response to a single refresh command. When the local memory controller 260 is operating according to a self-refresh mode, the local memory controller 260 may adjust timing parameters or a quantity of rows of the memory die 200 that are refreshed in a single refresh operation. For example, in order to increase the refresh rate of memory die 200, the local memory controller 260 may decrease the periodicity of refresh operations or may increase a quantity of rows of the memory die 200 that are refreshed during the execution of a single refresh operation, or may adjust both parameters in combination.

Figure 3:
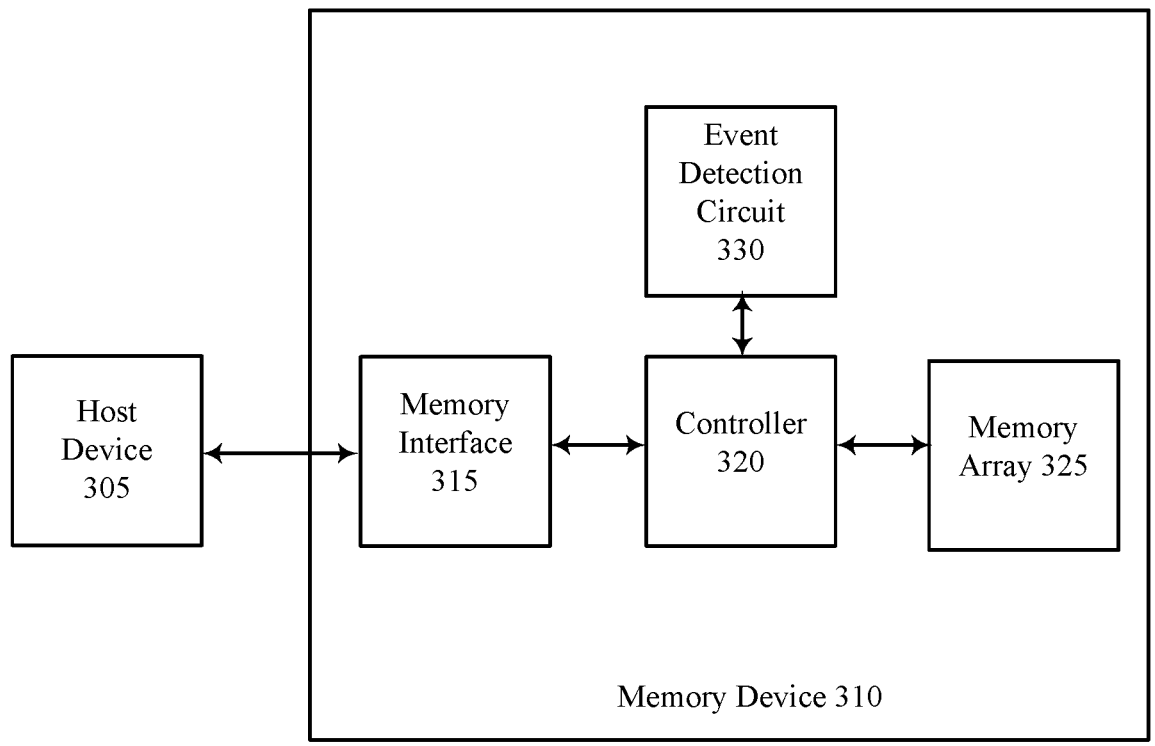
FIG. 3 illustrates an example of a system that supports refresh rate control for a memory device as disclosed herein.

FIG. 3 illustrates an example of a system 300 that supports techniques for refresh rate control for a memory device. The system 300 may include one or more components described herein with reference to FIGS. 1 and 2, among others. For example, the system 300 may include a host device 305, which may be an example of the external memory controller 105 as described with reference to FIG. 1; a memory device 310, which may be an example of the memory device 110, the memory dice 160, or the memory die 200 as described with reference to FIGS. 1 and 2; a controller 320, which may be an example of the device memory controller 155, one or more local memory controllers 165, or the local memory controller 260 as described with reference to FIGS. 1 and 2, or any combination thereof; a memory array 325, which may be an example of the memory arrays 170 as described with reference to FIG. 1. The memory device 310 may also include an event detection circuit 330.

Host device 305 may send commands to memory device 310, which may be received via the memory interface 315. The commands may include refresh commands to perform one or more refresh operations (e.g., refreshing memory cells at one or more physical rows of memory array 325). The controller 320 may receive commands from the memory interface 315, process the commands, and execute the commands on memory array 325. Controller 320 may operate the memory array 325 according to various modes of operation. For example, controller 320 may operate the memory array 325 according to an automatic refresh mode or a self-refresh mode.

Memory array 325 may include one or more memory banks, each of which may include one or more rows and/or one or more columns. In some cases, upon determining to perform one or more refresh operations, controller 320 may initiate refresh of memory cells at one or more physical locations (e.g., rows, columns, etc.). The refresh operation may specify an address for refresh (e.g., a row address), and memory device 310 (e.g., controller 320) may determine one or more additional addresses for refresh according to an internal counter (e.g., by incrementing a row address counter so as to obtain one or more additional row addresses). In this regard, one or more refresh operations may be initiated by controller 320. The controller 320 may initiate a refresh operation based on receiving refresh commands from host device 305 (e.g., during an automatic refresh mode) or based on generating the refresh operation at the controller 320 (e.g., during a self-refresh mode). The controller 320 may refresh the corresponding (e.g., as specified or determined based on the refresh operation) memory cells within the memory array 325.

The memory device 310 may perform a series of refresh operations until all rows of memory array 325 have been refreshed. The refresh operations may be performed at multiple physical locations (e.g., multiple rows) concurrently (e.g., for different banks or sub-arrays), offset according to some pattern (e.g., different rows at different times), or the like. In some cases, the controller 320 may perform the refresh operations interspersed with other accesses of memory array 325 (e.g., read, write, etc.). The periodicity of refresh operations (e.g., how often the controller 320 initiates a refresh operation) combined with the quantity of rows refreshed in response to each refresh operation may determine a refresh rate for the memory array 325 (e.g., the inverse of the periodicity that each of the memory cells of the memory array 325 are refreshed). Upon initialization (e.g., power up), the memory device 310 may be configured to perform refresh operations according to a default refresh configuration. The default refresh configuration may include the memory device 310 operating according to a set of refresh parameters (e.g., a refresh rate, a refresh periodicity, a quantity of rows refreshed during each refresh operation) defined prior to initialization of the memory device 310.

The controller 320 may dynamically determine a refresh rate for the memory array 325 based on the data integrity of the memory array 325. In some cases, the memory array 325 may have a refresh rate parameter indicated by an industry standard or specification, where the controller 320 may ensure that the refresh rate is equal to or faster than the indicated refresh rate. In some other cases, the memory array 325 may detect an event. For example, certain events may impact data integrity (e.g., decrease the data integrity) of the memory array 325.

In some cases, the memory array 325 may exhibit higher data integrity when operating within a nominal temperature range (e.g., including room temperature) than when the event detection circuit 330 detects an extreme temperature at the memory device 310 (e.g., a temperature significantly higher or lower than room temperature). In a second example, the memory array 325 may exhibit lower data integrity when certain voltage events are detected at the memory device 310 (e.g., in the event that a power supply voltage is low or unstable). As a result of the detected event, the controller 320 may determine to adjust the refresh rate of the memory array 325.

The event detection circuit 330 may detect events that affect the data integrity of the memory array 325. For example, the event detection circuit 330 may detect a temperature of the memory device 310. The event detection circuit 330 may detect an event associated with decreased data integrity when the temperature of the memory device 310 exceeds a certain threshold (e.g., the temperature of the memory device 310 is too high or too low). In a second example, the event detection circuit 330 may measure certain voltage levels of the memory device 310 (e.g., a voltage level of a power supply for the memory device 310). The event detection circuit 330 may detect an event associated with decreased data integrity if a measured voltage level goes below a threshold voltage level (e.g., for a certain time or a certain quantity of times within a time period).

In a third example, the event detection circuit 330 may detect a quantity of error events at the memory array 325. For example, the controller 320 may perform error detection or error correction operations during read and write operations to correct bit errors at the memory array 325. The event detection circuit 330 may monitor a quantity of error correction operations and error detections at the memory array 325 and may detect an event associated with decreased data integrity if a quantity of errors (e.g., corrected and/or detected) exceeds a threshold quantity. The threshold quantity may correspond to a quantity of errors detected within a certain time period (e.g., a maximum quantity of errors within a one (1) second window), within a certain portion of the memory array 325 (e.g., a maximum quantity of errors from a row or group of rows of the memory array 325), a certain quantity of single-bit errors, a certain quantity of multi-bit errors, or a combination thereof.

In a fourth example, the event detection circuit 330 may determine that the refresh operations do not satisfy an industry standard or specification for the memory device 310 (e.g., the refresh operations do not satisfy a refresh rate parameter). Here, the event detection circuit 330 may determine a current refresh rate (e.g., the time it takes to refresh the memory array 325 based on a current refresh operation execution periodicity in combination with a quantity of rows of the memory array 325 that are refreshed during the execution of each refresh operation) and compare the current refresh rate to the refresh rate parameter. The event detection circuit 330 may detect an event associated with decreased data integrity if the current refresh rate is less than the refresh rate parameter. In the case that the memory device 310 is operating according to an automatic refresh mode, the event detection circuit 330 may determine a current refresh rate based on the current periodicity of received refresh commands and compare this refresh rate to the refresh rate parameter.

For example, the event detection circuit 330 may determine that, based on the quantity of rows of the memory array 325 that are refreshed during the execution of each operation, a certain quantity R of refresh operations may refresh the memory array 325. The refresh rate parameter may be to receive the R refresh commands with in a time period T. The event detection circuit 330 may determine that the current refresh command periodicity may not cause the memory array 325 to receive R refresh commands within the time period T. In some cases, the event detection circuit 330 may make a predictive determination based on some fractions of R and T. For example, the event detection circuit 330 may detect that R/2 refresh commands have not been received within a time period of T/2. Additionally or alternatively, the event detection circuit 330 may determine that a remaining time period in a refresh cycle having a period T is insufficient to complete refreshing all rows of the array. For example, the event detection circuit 330 may determine that, based on a quantity $R_1$ of refresh commands received in a time period $T_1$, where $T_1<T$, it is not feasible or likely to receive $R-R_1$ refresh commands in the time period $T-T_1$. Here, the event detection circuit 330 may detect an event associated with decreased data integrity.

In a fifth example, the event detection circuit 330 may detect a health of various components within the memory device 310. For example, the event detection circuit 330 may detect a degradation of a row detection circuit or a sense amplifier of the memory device, which may in turn result in the event detection circuit 330 detecting an event associated with a decrease in data integrity. The event detection circuit 330 may detect a degradation of certain components based on a quantity of error correction operations and a quantity of error detections corresponding to certain portions of the memory array 325 (e.g., certain rows, columns, sub-arrays). The event detection circuit 330 may determine if a quantity of error correction operations and a quantity of error detections corresponding to a portion of the memory array 325 falls below a threshold. In the event that the quantity of error correction operations and error detections is above the threshold, the event detection circuit 330 may detect an event associated with decreased data integrity.

The thresholds (e.g., for detecting events associated with decreased data integrity) may be preconfigured at the memory device 310. Additionally or alternatively, the thresholds may be indicated (e.g., via the memory interface 315) by the host device 305. In some cases, the thresholds may be codependent. That is, the thresholds for events (e.g., temperature events, voltage events, error events) may be based on the combination of multiple detected events. For example, if the event detection circuit 330 detects a first temperature at the memory array 325, the event detection circuit 330 may not detect an event associated with a decreased data integrity. However, if the event detection circuit 330 detects the first temperature in combination with a voltage condition (e.g., a low voltage supply condition), the event detection circuit 330 may detect an event associated with a decreased data integrity.

In the event that the event detection circuit 330 detects an event associated with decreased data integrity for the memory array 325, the event detection circuit 330 may indicate (e.g., flag) the event to the controller 320. In some cases, the event detection circuit 330 may transmit a notification of the event to the controller 320 when the event is detected. Alternatively, the controller 320 may poll a flag set by the event detection circuit 330 prior to executing a refresh operation to determine any detected events. The controller 320 may adapt the refresh rate of the memory array 325 based on receiving an indication of the event from the event detection circuit 330. In a case when the controller 320 is operating according to an automatic refresh mode, the controller 320 may adapt a quantity of rows executed per refresh command (e.g., as received from the host device 305). For example, the controller 320 may receive an indication of an event from the event detection circuit 330 and determine to increase the refresh rate of the memory array 325 and increase the quantity of rows refreshed per refresh command (e.g., from four rows to six, eight, ten, twelve, or sixteen rows). In the case when the controller 320 is operation according to a self-refresh mode, the controller 320 may adapt a periodicity of the refresh operations and/or the quantity of rows refreshed per refresh operation.

When the controller 320 adapts the refresh rate of the memory array 325, the controller 320 may transmit a notification of the adapted refresh rate to the host device 305. The notification may indicate the adapted refresh status (e.g., that the refresh rate has been adapted). Additionally or alternatively, the notification may indicate the event detected by the event detection circuit 330. In some cases, the notification may be communicated by the memory interface 315. For example, the memory device 310 may transmit the notification by a pin of the memory interface 315. In some cases, the pin may be multifunctional (e.g., used to transmit data or other types of signaling as well). In some other cases, the pin may be dedicated for the notification. In another example, the memory device 310 may transmit the notification by a sideband communication scheme (e.g., by a communication bus other than the memory data interface such as an inter-integrated circuit (I²C) bus).

The host device 305 may detect the notification and determine whether to reset the memory device 310. Resetting the memory device 310 may include the memory device 310 adapting the refresh parameters (e.g., refresh operation periodicity, a quantity of rows refreshed per refresh operation) based on a notification received from the host device 305. For example, the host device 305 may determine to reset the memory device 310 to the previous refresh parameters (e.g., the parameters utilized prior to adapting the refresh parameters based on detection the event associated with a decrease in data integrity). If the host device 305 determines to reset the memory device 310, the host device 305 may transmit a notification to the memory device 310. Based on receiving the reset notification, the memory device 310 may adapt the refresh parameters for the memory device 310.

Figure 4:
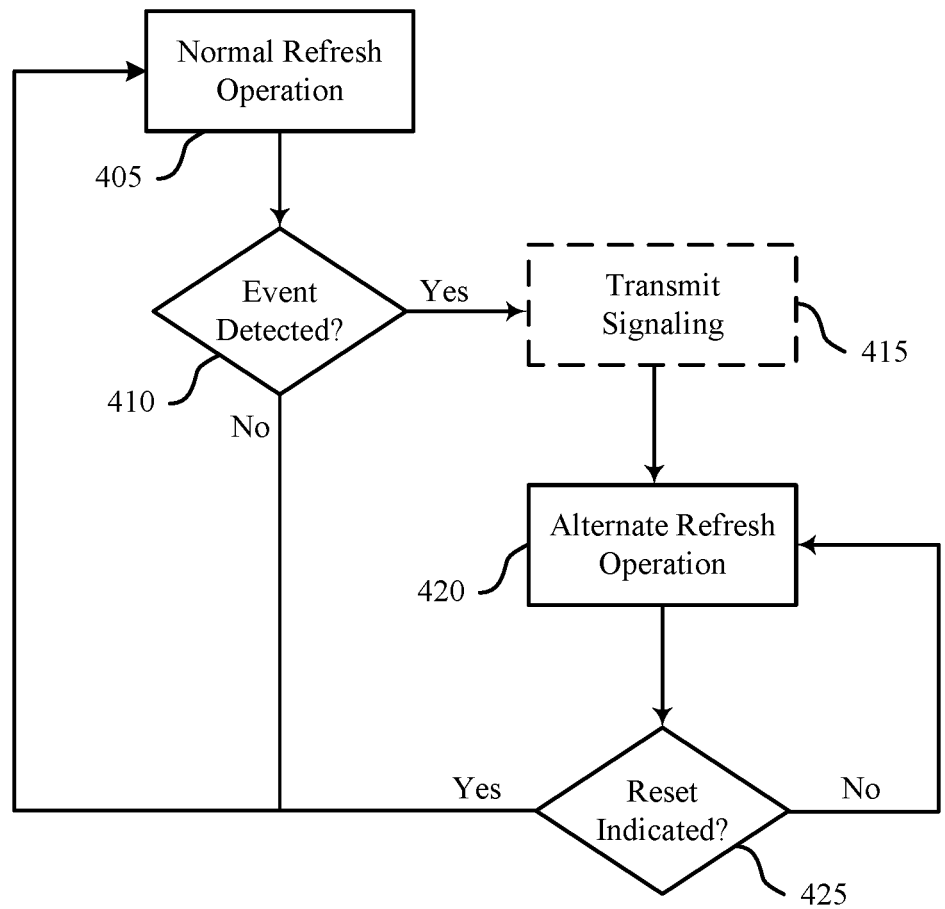
FIGS. 4 through 6 illustrate examples of process flows that supports refresh rate control for a memory device as disclosed herein.

FIG. 4 shows an example diagram of a process flow 400 that supports techniques for refresh rate control for a memory device. The features of process flow 400 may be implemented or performed by a memory device (e.g., the memory device 110, the memory dice 160, the memory die 200, or the memory device 310 described with reference to FIGS. 1 through 3, among others) or a component of a memory device such as the device memory controller 155, the local memory controllers 165, the local memory controller 260, the controller 320, or the refresh detection circuit 335 as described with reference to FIGS. 1 through 3.

At 405, a memory device may be operating according to a default refresh configuration. The default refresh configuration may include the memory device operating according to some preconfigured refresh parameters (e.g., a refresh periodicity, a quantity of rows refreshed during each refresh operation, and/or a refresh rate). The memory device may be operating according to an automatic refresh mode or a self-refresh mode. The automatic refresh mode may include the memory device executing refresh operations based on a refresh commands received from a host device (e.g., according to a refresh periodicity defined by a periodicity of the refresh commands). The self-refresh mode may include the memory device executing refresh operations based on self-generated refresh operations (e.g., by a controller at the memory device and based on an internal clock).

At 410, the memory device may determine whether an event (e.g., associated with decreased data integrity) is detected at the memory device. For example, the event detection circuit 330 (e.g., as described with reference to FIG. 3) may determine that a temperature threshold for the memory device has been exceeded. In some other cases, the memory device may detect an event related to a voltage level of the memory device, errors at a memory array of the memory device, component health, or not meeting a parameter indicated by an industry standard or specification for the memory device. The memory device may detect the events based on determining if a threshold has been satisfied.

For example, the memory device may detect an event in the case that a temperature threshold has been satisfied (e.g., the temperature of the memory device is higher or lower than a temperature threshold). In another example, the memory device may detect an event in the case that a voltage level for the memory device has been satisfied (e.g., the power supply for the memory device falls below a threshold, is below the threshold for a certain period of time, or falls below the threshold a certain quantity of times within a time period). In some cases, the thresholds may adapt based on a combination of detected events. For example, the temperature threshold may adjust based on a temperature trend (e.g., the maximum temperature threshold may decrease if the temperature level is quickly rising). In another example, the threshold voltage corresponding to a minimum voltage level supplied to the memory device may increase in the event that the temperature of the memory device approaches a temperature threshold.

In some cases, the event detection circuit 330 may generate one or more bits indicative of the event associated with decreased data integrity and transmit the indication to a controller associated with the memory device (e.g., the controller 320 as discussed with reference to FIG. 3). In some other cases, the controller associated with the memory device may poll the event detection circuit 330 at a certain periodicity to determine if the event has been detected. For example, the controller may poll the event detection circuit 330 prior to executing each refresh command.

In a first case, the memory device may determine at block 410 that there was not an event associated with a decreased data integrity detected at the memory device. Here, the memory device may continue to operate according to the default refresh operation (e.g., as described at 405).

In a second case, the memory device may determine at block 410 that the event associated with decreased data integrity is detected. Here, the memory device may proceed to block 415. At block 415, the memory device may transmit signaling to the host device indicating that the memory device will begin executing refresh commands according to an alternative refresh configuration associated with a different refresh rate. Additionally or alternatively, the memory device may indicate the event detected by the event detection circuit 330. The memory device may indicate the alternative refresh configuration by a pin at a memory interface of the memory device. In some cases, the pin may be multifunctional (e.g., used to transmit data as well). In some other cases, the pin may be dedicated for the notification. In another example, the memory device may transmit the notification by a sideband communication scheme.

At 420, the memory device may adapt to operate according to an alternative refresh configuration which may be associated with a different refresh rate (e.g., when compared to the default refresh configuration). In a case when the memory device is operating according to an automatic refresh mode, the memory device may adapt a quantity of rows executed per refresh command (e.g., as received from the host device). For example, the alternative refresh operation may have refresh rate that is increased by a factor (e.g., 2×, 3×, 4×), and the memory device may increase a quantity of rows refreshed per refresh command from based on the factor. In the case when the memory device is operating according to a self-refresh mode, the memory device may adapt a periodicity of the refresh operations and/or the quantity of rows refreshed per refresh operation. For example, if the alternative refresh configuration corresponds to an increased refresh rate, the memory device may increase the refresh operation periodicity, increase the quantity of rows of the memory array refreshed during each refresh operation, or both.

At 425, the memory device may identify whether a reset operation has been indicated by the host device. The reset operation may correspond to resetting the memory device from the alternative refresh configuration to the default configuration. When the memory device determines that the reset operation has been indicated, the memory device may proceed to block 405, where the memory device will operate according to the default refresh configuration (e.g., according to a set of refresh parameters preconfigured for the memory device). Alternatively, when the memory device determines that the reset operation has not been indicated, the memory device may proceed to block 420 (e.g., the memory device may continue to operate according to the refresh parameters defined by the alternative refresh configuration).

Figure 5:
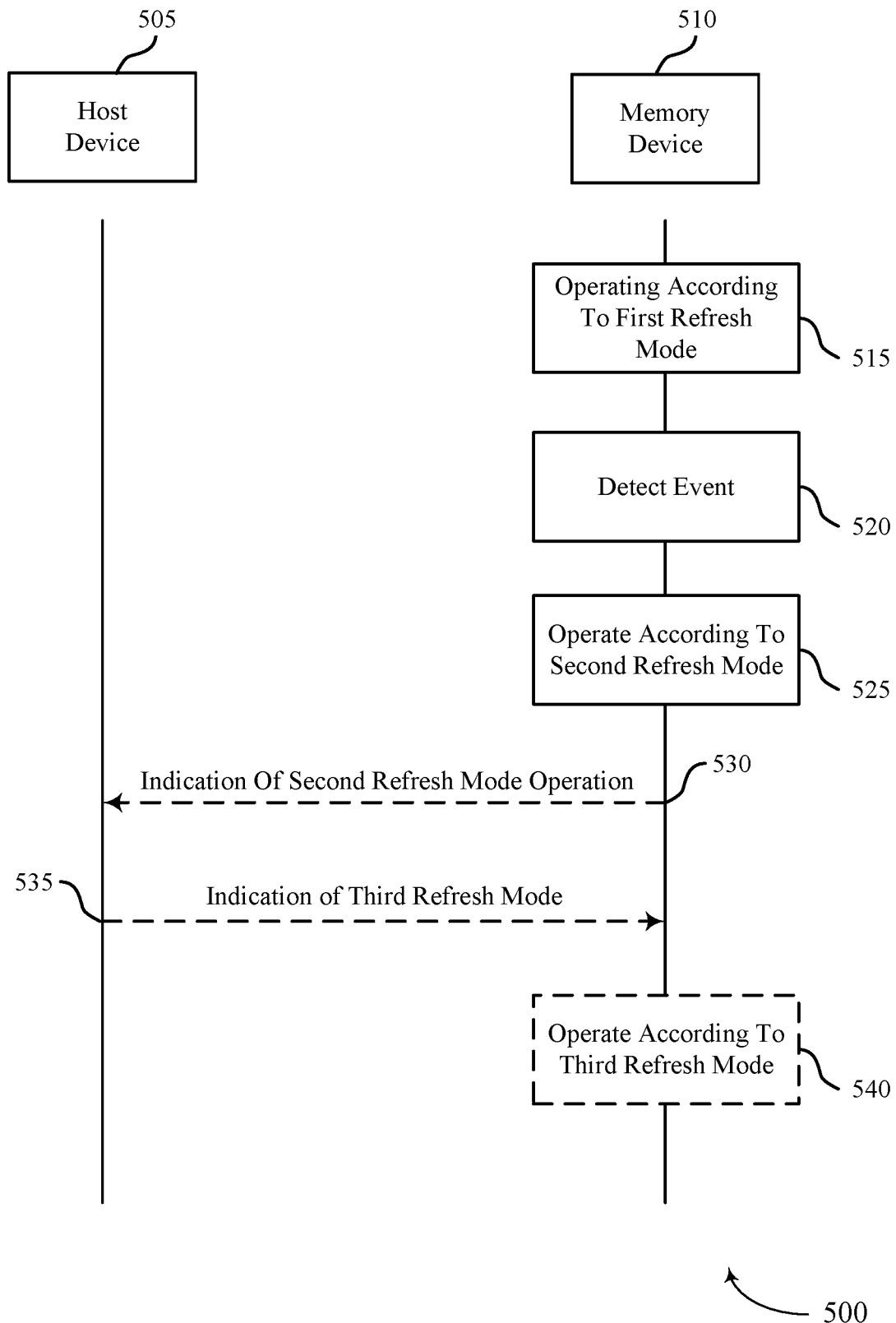

FIG. 5 illustrates an example of a process flow 500 that refresh rate control for a memory device as disclosed herein. The process flow 500 may implement aspects of the systems 100 and 300 and memory die 200 described with reference to FIGS. 1 through 3. The process flow 500 may include operations performed by a host device 505, which may be an example of host device 305 as described with reference to FIG. 3. Host device 505 may implement aspects of the external memory controller 105 as described with reference to FIG. 1. The process flow 500 may further include operations performed by a memory device 510, which may be an example of the memory device 110, the memory array 170, or the memory die 200, or the memory device 310 as described with reference to FIGS. 1 through 3.

At 515, the memory device 510 may operate a memory array of the memory device 510 according to a first refresh mode or configuration. Operating the memory array of the memory device 510 according to the first refresh mode may include the memory device 510 operating the memory according to a first set of refresh parameters corresponding to a first rate for refreshing the memory array. The first set of refresh parameters may include a first quantity of rows that are refreshed for each refresh operation. The memory device 510 may determine the first quantity of rows and a first refresh periodicity. Here, operating the memory array according to the first set of refresh parameters may include performing refresh operations at the first refresh periodicity. In some instances, the memory device 510 may receive a plurality of refresh commands from the host device 505. Here, the memory device 510 may operate the memory array according to the first set of refresh parameters by performing one refresh operation for each of the plurality of refresh commands. In some cases, the first refresh mode may correspond to a default refresh operation mode. That is, when the first refresh parameters may correspond to some preconfigured refresh parameters.

At 520, the memory device 510 may detect an event. The event may be associated with a reduction in data integrity at the memory array. For example, the event may correspond to one or more of a voltage condition, a data error condition, a minimum refresh rate, or a status of one or more components of the memory array. In some cases, the memory device 510 may determine that a temperature of the memory device 510 satisfies a threshold. Here, the memory device 510 may detect the event based on determining that the temperature satisfies the threshold. In some cases, the data error condition may be based on a rate of error corrections for a circuit initiating error correction on data stored in the memory array.

At 525, the memory device 510 may operate the memory array according to a second refresh mode. Operating the memory device 510 according to the second refresh mode may include the memory device 510 operating the memory array according to a second set of refresh parameters based at least in part on detecting the event, the second set of refresh parameters corresponding to a second rate for refreshing the memory array that is higher than (e.g., faster than) the first rate. The second set of refresh parameters may include a second quantity of rows that are refreshed for each refresh operation. In some cases, the memory device 510 may determine the second quantity of rows and a second refresh periodicity based on detecting the event. Here, operating the memory array according to the second set of refresh parameters may include performing the plurality of refresh operation at the second refresh periodicity. In some cases, the memory device 510 may switch, autonomously from the host device 505, from operating according to the first set of refresh parameters to operating according to the second set of refresh parameters based on detecting the event at the memory device 510. In some instances, the memory device 510 may receive a plurality of refresh commands from the host device 505. Here, the memory device 510 may operate the memory array according to the second set of refresh parameters by performing one refresh operation for each of the plurality of refresh commands. The second refresh mode may correspond to an alternate refresh operation as disclosed herein.

At 530, the memory device 510 may transmit an indication of the second refresh operation to the host device 505. That is, the memory device 510 may transmit signaling including an indication of operating the memory array according to the second set of refresh parameters based on detecting the event at the memory array (e.g., as discussed at 520). In some cases, the signaling may include one or more bits indicative of the event.

At 535, the memory device 510 may receive an indication of a third refresh mode (e.g., corresponding to a third set of refresh parameters) from the host device 505. That is, the memory device 510 may receive an indication to operate the memory array according to the third set of refresh parameters while operating the memory array according to the second set of refresh parameters.

At 540, the memory device 510 may operate according to a third refresh mode based on receiving the indication from the host device 505 (e.g., as discussed at 535). The third refresh mode may correspond to a third set of refresh parameters. In some cases, the third refresh mode may be the same as the first refresh mode. Here, the indication may indicate a reset operation where the memory device 510 may adapt to the first refresh parameters (e.g., and operate according to a default refresh operation mode).

Figure 6:
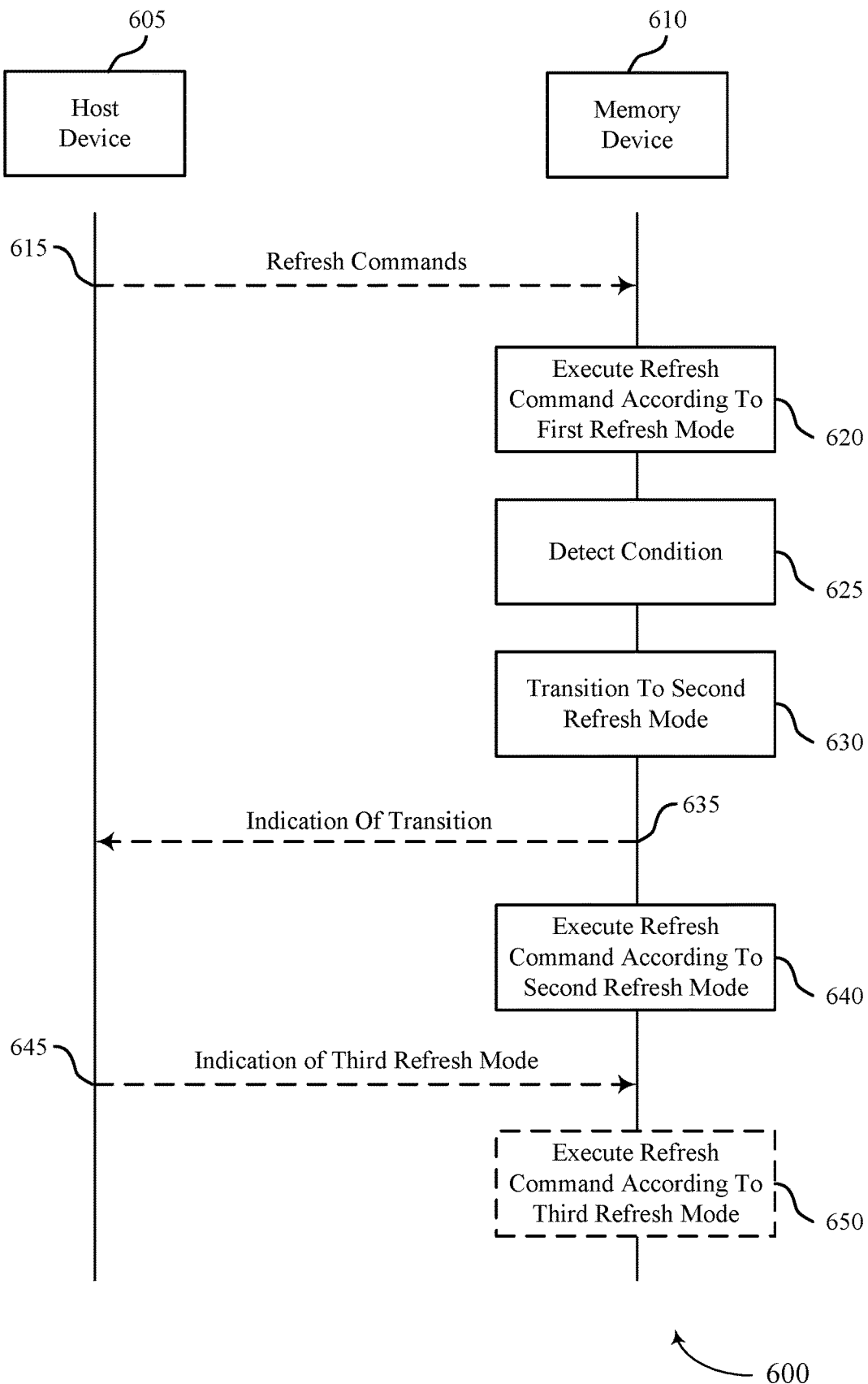

FIG. 6 illustrates an example of a process flow 600 that refresh rate control for a memory device as disclosed herein. The process flow 600 may implement aspects of the systems 100 and 300 and memory die 200 described with reference to FIGS. 1 through 3. The process flow 600 may include operations performed by a host device 605, which may be an example of host device 305 as described with reference to FIG. 3. Host device 605 may implement aspects of the external memory controller 105 as described with reference to FIG. 1. The process flow 600 may further include operations performed by a memory device 610, which may be an example of the memory device 110, the memory array 170, or the memory die 200, or the memory device 310 as described with reference to FIGS. 1 through 3.

At 615, the memory device 610 may receive, from the host device 605, a plurality of refresh commands for a memory array of the memory device 610.

At 620, the memory device may execute, at the memory array, a refresh command according to a first refresh mode. Executing a refresh command according to the first refresh mode may correspond to executing the refresh command according to a first set of refresh parameters. The first set of refresh parameters may include a first quantity of rows of the memory array that are refreshed during an execution of the first refresh command.

At 625, the memory device 610 may detect a condition of the memory array (e.g., associated with a reduction in data integrity). The condition may correspond to one or more of a temperature condition, a voltage condition, a data error condition, a minimum refresh command rate, or a condition of one or more components of the memory device 610.

At 630, the memory device 610 may transition to a second refresh mode based on detecting the condition. That is, the memory device 610 may transition from using the first set of refresh parameters to using a second set of refresh parameters (e.g., according to the second refresh mode) corresponding to an increased refresh rate. The second set of refresh parameters may include a second quantity of rows of the memory array that are refreshed during an execution of the second refresh command, wherein the second quantity of rows is greater than the first quantity of rows.

At 635, the memory device 610 may transmit an indication of the transition to the host device 605. The indication may indicate the determining to transition the memory array to the second set of refresh parameters. In some cases, the indication may include the condition detected by the memory device 610.

At 640, the memory device 610 may execute a second refresh command according to the second set of refresh parameters.

At 645, the memory device 610 may receive, from the host device 605, an indication of a third refresh mode. The indication may include signaling to transition the memory array from the second set of refresh parameters to a third set of refresh parameters, where the third set of refresh parameters may correspond to the third refresh mode. In some cases, the third set of refresh parameters may be the same as the first set of refresh parameters. Here, the indication may include a reset indication which may indicate to the memory device 610 to reset the refresh parameters to the first refresh parameters (which may correspond to a set of preconfigured refresh parameters).

At 650, the memory device 610 may execute a third refresh command according to the third refresh mode. The memory device 610 may execute the third refresh command at the memory array according to the third set of refresh parameters based on the indication of the third refresh mode received from the host device 605.

Figure 7:
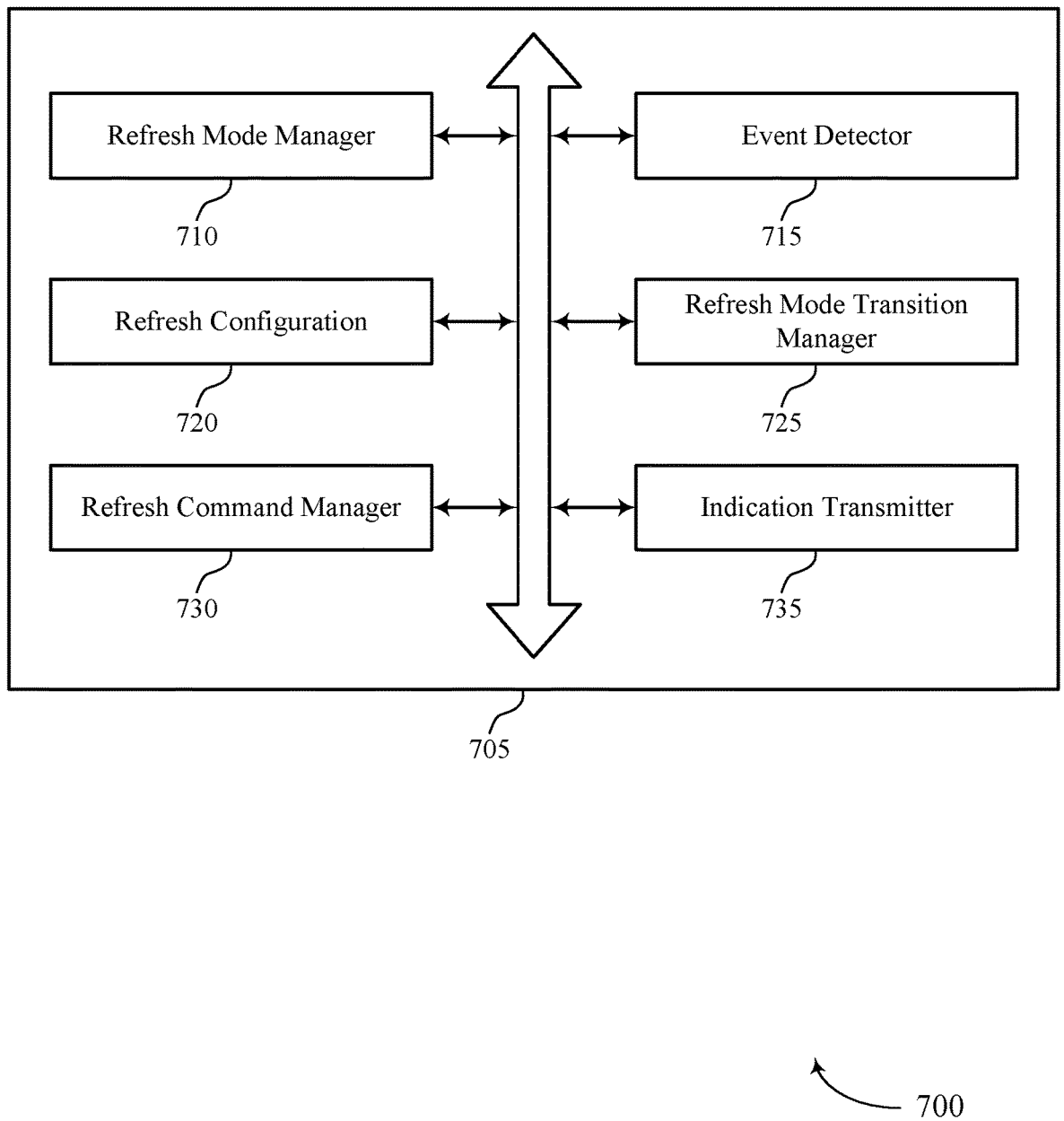
FIG. 7 shows a block diagram of a device that supports refresh rate control for a memory device as disclosed herein.

FIG. 7 shows a block diagram 700 of a device 705 that supports refresh rate control for a memory device as disclosed herein. The device 705 may be an example of aspects of memory device 110, memory device 310, memory device 510, and memory device 610 as disclosed herein with reference to FIGS. 1, 3, 5, and 6. The device 705 may include a refresh mode manager 710, an event detector 715, a refresh configuration 720, a refresh mode transition manager 725, a refresh command manager 730, and an indication transmitter 735. Each of these modules may communicate, directly or indirectly, with one another (e.g., via one or more buses).

The refresh mode manager 710 may operate a memory array of a memory device according to a first set of refresh parameters of the refresh configuration 720 corresponding to a first rate for refreshing the memory array. The refresh configuration 720 may store, for example, one or more refresh configurations (e.g., sets of refresh parameters), and may have predetermined (e.g., default) values for the sets of refresh parameters, or may have programmable sets of refresh parameters that may be configured by a host device. In some cases, the first set of refresh parameters include a first quantity of rows that are refreshed for each of a set of refresh operations. In some examples, the refresh mode manager 710 may determine the first quantity of rows and a first refresh periodicity, where operating the memory array according to the first set of refresh parameters includes performing the set of refresh operations at the first refresh periodicity.

The refresh mode manager 710 may execute, at the memory array, a first refresh command of the set of refresh commands according to a first set of refresh parameters of the refresh configuration 720. In some cases, the first set of refresh parameters includes a first quantity of rows of the memory array that are refreshed during an execution of the first refresh command.

The event detector 715 may detect, at the memory device, an event (e.g., associated with a reduction in data integrity at the memory array) corresponding to at least one of a voltage condition, a data error condition, a minimum refresh rate, or a status of one or more components of the memory array. In some examples, the event detector 715 may determine, by the memory device, that a temperature of the memory device satisfies a threshold, where detecting the event at the memory array is based on determining that the temperature of the memory device satisfies the threshold. In some cases, the data error condition is based on a rate of error corrections for a circuit initiating error correction on data stored in the memory array.

The event detector 715 may detect, at the memory device, a condition of the memory array (e.g., associated with a reduction in data integrity). In some cases, the condition corresponds to one or more of a temperature condition, a voltage condition, a data error condition, a minimum refresh command rate, or a condition of one or more components of the memory device.

The refresh mode manager 710 may operate the memory array according to a second set of refresh parameters of the refresh configuration 720 based on detecting the event, the second set of refresh parameters corresponding to a second rate for refreshing the memory array that is faster than the first rate. In some cases, the second set of refresh parameters include a second quantity of rows that are refreshed for each of the set of refresh operations. In some examples, the refresh mode manager 710 may determine, based on detecting the event at the memory array, the second quantity of rows and a second refresh periodicity, where operating the memory array according to the second set of refresh parameters includes performing the set of refresh operations at the second refresh periodicity.

The refresh mode manager 710 may execute, at the memory array, a second refresh command of the set of refresh commands according to the second set of refresh parameters of the refresh configuration 720. In some cases, the second set of refresh parameters includes a second quantity of rows of the memory array that are refreshed during an execution of the second refresh command, where the second quantity of rows is greater than the first quantity of rows.

The refresh mode transition manager 725 may switch, by the memory device (e.g., autonomously from a host device), from operating according to the first set of refresh parameters to operating according to the second set of refresh parameters based on detecting the event at the memory device. The refresh mode transition manager 725 may transition, based on detecting the condition, from using the first set of refresh parameters to using a second set of refresh parameters corresponding to an increased refresh rate.

The refresh command manager 730 may receive, from a host device, a set of refresh commands, where operating the memory array according to the first set of refresh parameters or the second set of refresh parameters includes performing one of the set of refresh operations for each of the set of refresh commands. The refresh command manager 730 may receive, from a host device, a set of refresh commands for a memory array of a memory device.

The indication transmitter 735 may transmit, to a host device based on detecting the event at the memory array, signaling including an indication of operating the memory array according to the second set of refresh parameters. In some cases, the signaling includes one or more bits indicative of the event. The indication transmitter 735 may transmit, to the host device and based on determining to transition the memory array from the first set of refresh parameters to the second set of refresh parameters, an indication of the determining to transition the memory array to the second set of refresh parameters. In some examples, the indication transmitter 735 may transmit, to the host device, an indication of the condition detected by the memory device.

The refresh mode manager 710 may receive, from a host device while operating the memory array according to the second set of refresh parameters, an indication to operate the memory array according to a third set of refresh parameters. In some examples, the refresh mode manager 710 may operate the memory array according to the third set of refresh parameters of the refresh configuration based on receiving the indication from the host device. The refresh mode manager 710 may receive, from the host device, signaling including an indication to transition the memory array from the second set of refresh parameters to a third set of refresh parameters. In some examples, the refresh mode manager 710 may execute, at the memory array, a third refresh command of the set of refresh commands according to the third set of refresh parameters based on signaling received from the host device.

Figure 8:
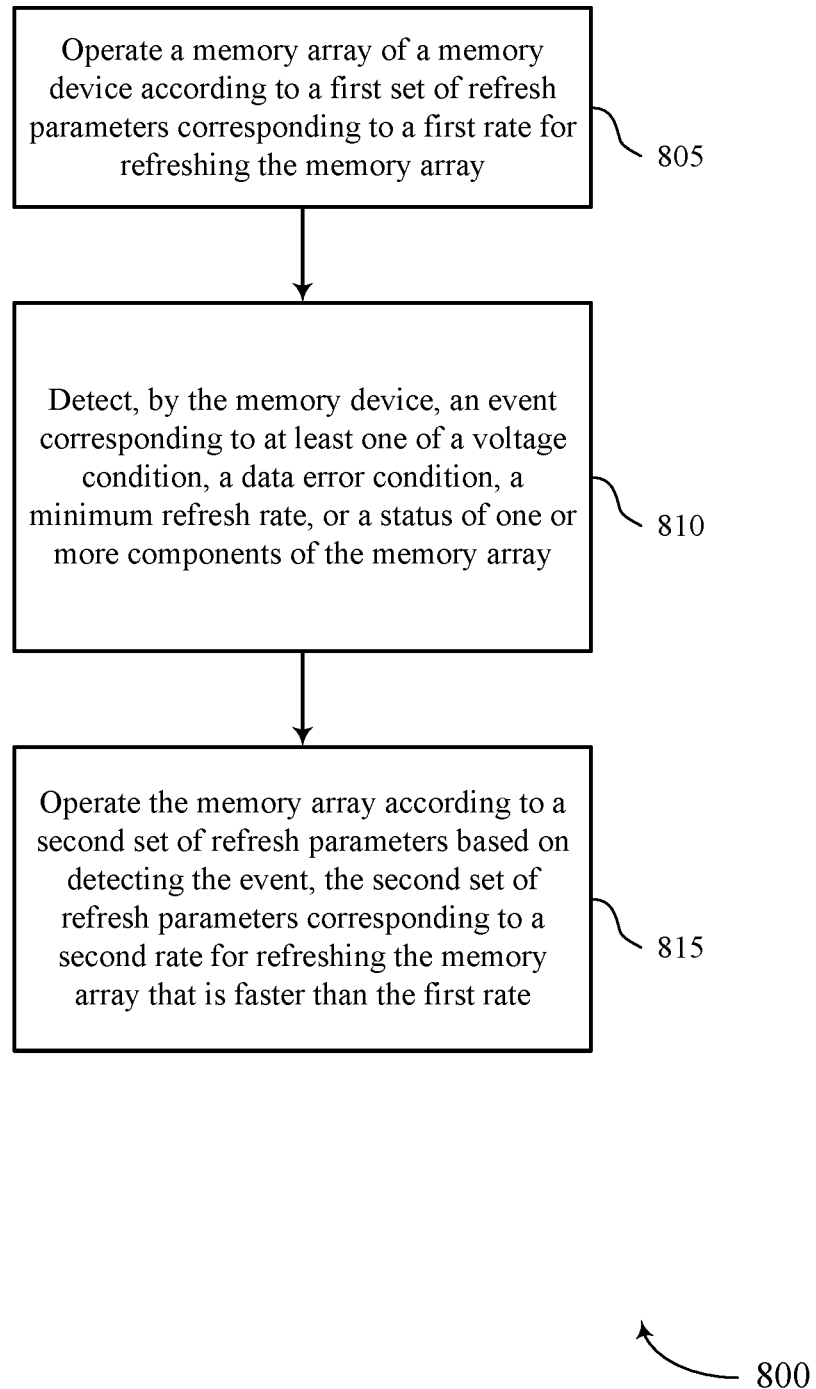
FIGS. 8 through 11 show flowcharts illustrating a method or methods that supports refresh rate control for a memory device as disclosed herein.

FIG. 8 shows a flowchart illustrating a method 800 that supports refresh rate control for a memory device as disclosed herein. The operations of method 800 may be implemented by a memory device (e.g., memory device 110, memory device 310, memory device 510, and memory device 610 as disclosed herein with reference to FIGS. 1, 3, 5, and 6) or its components as described herein. For example, the operations of method 800 may be performed by a device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may operate a memory array of the memory device according to a first set of refresh parameters corresponding to a first rate for refreshing the memory array. The operations of 805 may be performed according to the methods described herein. In some examples, aspects of the operations of 805 may be performed by a refresh mode manager as described with reference to FIG. 7.

At 810, the memory device may detect an event corresponding to at least one of a voltage condition, a data error condition, a minimum refresh rate, or a status of one or more components of the memory array. The operations of 810 may be performed according to the methods described herein. In some examples, aspects of the operations of 810 may be performed by an event detector as described with reference to FIG. 7.

At 815, the memory device may operate the memory array according to a second set of refresh parameters based on detecting the event, the second set of refresh parameters corresponding to a second rate for refreshing the memory array that is faster than the first rate. The operations of 815 may be performed according to the methods described herein. In some examples, aspects of the operations of 815 may be performed by a refresh mode manager as described with reference to FIG. 7.

Some examples of the method 800 and the apparatus described herein may further include operations, features, means, or instructions for operating a memory array of a memory device according to a first set of refresh parameters corresponding to a first rate for refreshing the memory array, detecting, by the memory device, an event corresponding to at least one of a voltage condition, a data error condition, a minimum refresh rate, or a status of one or more components of the memory array, and operating the memory array according to a second set of refresh parameters based on detecting the event, the second set of refresh parameters corresponding to a second rate for refreshing the memory array that is faster than the first rate.

Some examples of the method 800 and the apparatus described herein may further include operations, features, means, or instructions for switching, by the memory device and autonomously from a host device, from operating according to the first set of refresh parameters to operating according to the second set of refresh parameters based on detecting the event at the memory device.

Some cases of the method 800 and the apparatus described herein may further include operations, features, means, or instructions for determining, by the memory device, that a temperature of the memory device satisfies a threshold, where detecting the event at the memory array may be based on determining that the temperature of the memory device satisfies the threshold.

In some examples of the method 800 and the apparatus described herein the first set of refresh parameters include a first quantity of rows that may be refreshed for each of a set of refresh operations, and the second set of refresh parameters include a second quantity of rows that may be refreshed for each of the set of refresh operations.

In some instances, the method 800 and the apparatus described herein may further include operations, features, means, or instructions for determining, by the memory device, the first quantity of rows and a first refresh periodicity, where operating the memory array according to the first set of refresh parameters includes performing the set of refresh operations at the first refresh periodicity, and determining, by the memory device and based on detecting the event at the memory array, the second quantity of rows and a second refresh periodicity, where operating the memory array according to the second set of refresh parameters includes performing the set of refresh operations at the second refresh periodicity.

In some examples, the method 800 and the apparatus described herein may further include operations, features, means, or instructions for receiving, from a host device, a set of refresh commands, where operating the memory array according to the first set of refresh parameters or the second set of refresh parameters includes performing one of the set of refresh operations for each of the set of refresh commands.

In some cases of the method 800 and the apparatus described herein the data error condition may be based on a rate of error corrections for a circuit initiating error correction on data stored in the memory array.

In some instances, the method 800 and the apparatus described herein may further include operations, features, means, or instructions for transmitting, to a host device based on detecting the event at the memory array, signaling including an indication of operating the memory array according to the second set of refresh parameters.

In some examples of the method 800 and the apparatus described herein the signaling includes one or more bits indicative of the event.

Some examples of the method 800 and the apparatus described herein may further include operations, features, means, or instructions for receiving, from a host device while operating the memory array according to the second set of refresh parameters, an indication to operate the memory array according to a third set of refresh parameters, and operating the memory array according to the third set of refresh parameters based on receiving the indication from the host device.

Figure 9:
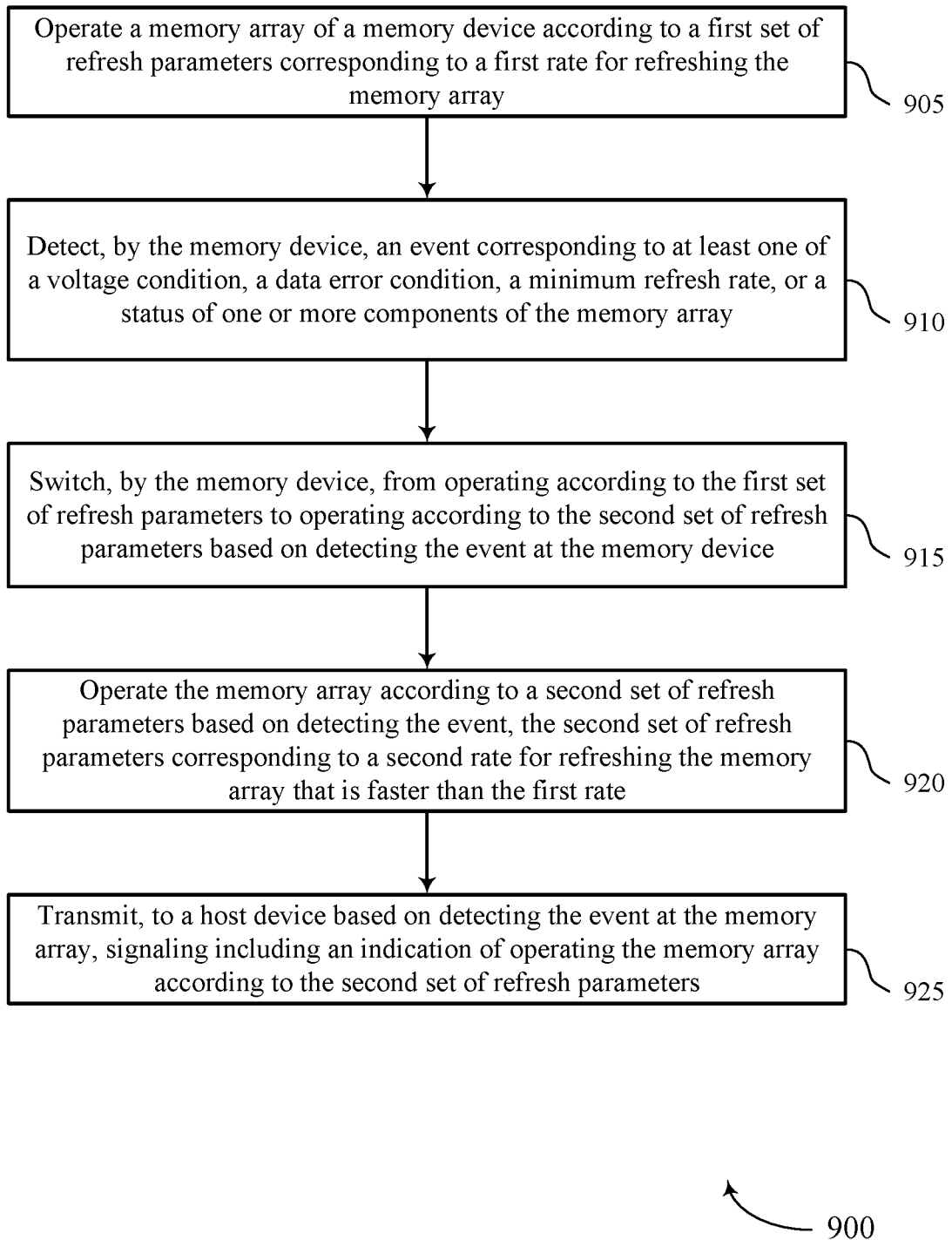

FIG. 9 shows a flowchart illustrating a method 900 that supports refresh rate control for a memory device as disclosed herein. The operations of method 900 may be implemented by a memory device (e.g., memory device 110, memory device 310, memory device 510, and memory device 610 as disclosed herein with reference to FIGS. 1, 3, 5, and 6) or its components as described herein. For example, the operations of method 900 may be performed by a device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may operate a memory array of the memory device according to a first set of refresh parameters corresponding to a first rate for refreshing the memory array. The operations of 905 may be performed according to the methods described herein. In some examples, aspects of the operations of 905 may be performed by a refresh mode manager as described with reference to FIG. 7.

At 910, the memory device may detect an event corresponding to at least one of a voltage condition, a data error condition, a minimum refresh rate, or a status of one or more components of the memory array. The operations of 910 may be performed according to the methods described herein. In some examples, aspects of the operations of 910 may be performed by an event detector as described with reference to FIG. 7.

At 915, the memory device may switch from operating according to the first set of refresh parameters to operating according to the second set of refresh parameters based on detecting the event at the memory device. The operations of 915 may be performed according to the methods described herein. In some examples, aspects of the operations of 915 may be performed by a refresh mode transition manager as described with reference to FIG. 7.

At 920, the memory device may operate the memory array according to a second set of refresh parameters based on detecting the event, the second set of refresh parameters corresponding to a second rate for refreshing the memory array that is faster than the first rate. The operations of 920 may be performed according to the methods described herein. In some examples, aspects of the operations of 920 may be performed by a refresh mode manager as described with reference to FIG. 7.

At 925, the memory device may transmit, to a host device based on detecting the event at the memory array, signaling including an indication of operating the memory array according to the second set of refresh parameters. The operations of 925 may be performed according to the methods described herein. In some examples, aspects of the operations of 925 may be performed by an indication transmitter as described with reference to FIG. 7.

Figure 10:
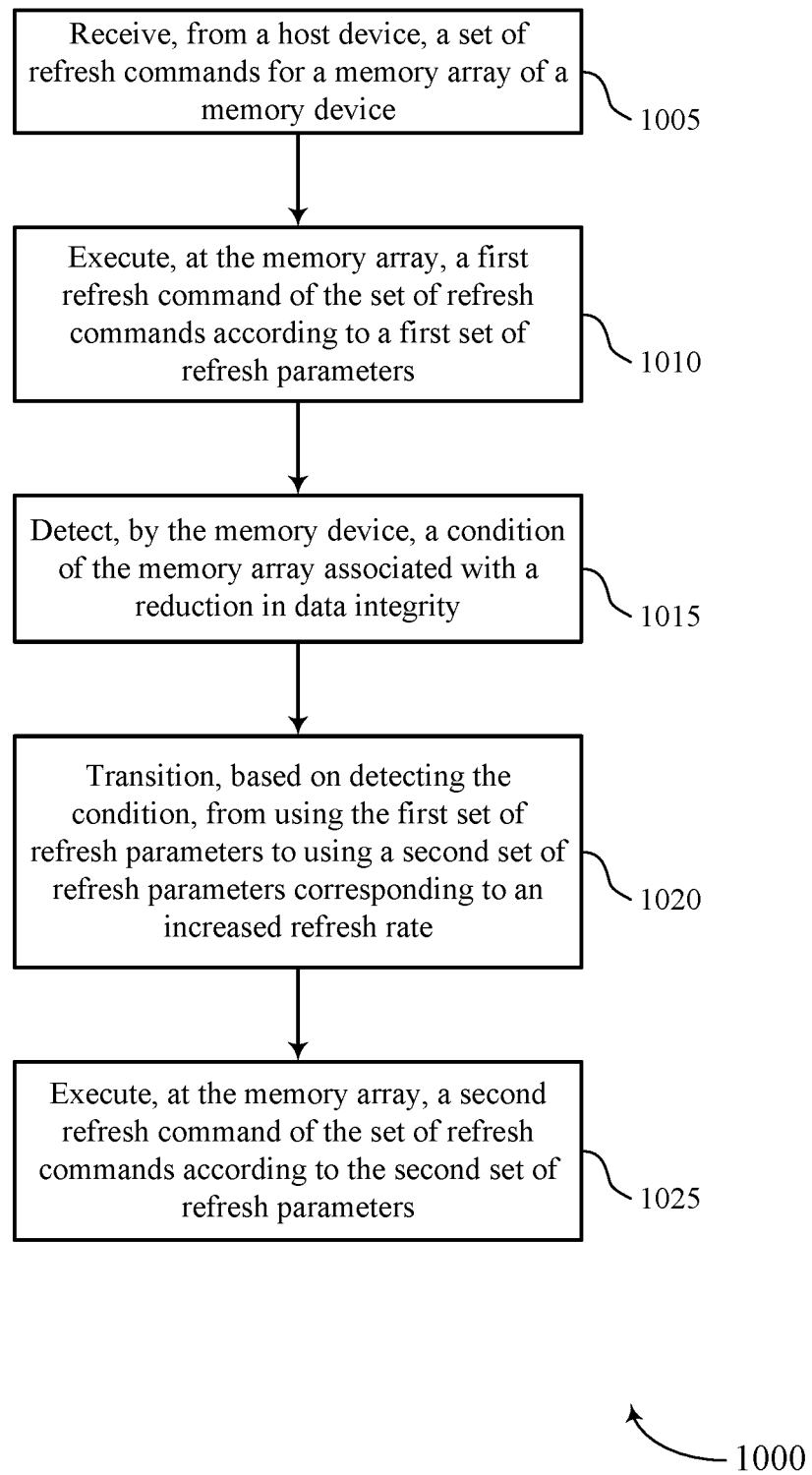

FIG. 10 shows a flowchart illustrating a method 1000 that supports refresh rate control for a memory device as disclosed herein. The operations of method 1000 may be implemented by a memory device (e.g., memory device 110, memory device 310, memory device 510, and memory device 610 as disclosed herein with reference to FIGS. 1, 3, 5, and 6) or its components as described herein. For example, the operations of method 1000 may be performed by a device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may receive, from a host device, a set of refresh commands for a memory array of the memory device. The operations of 1005 may be performed according to the methods described herein. In some examples, aspects of the operations of 1005 may be performed by a refresh command manager as described with reference to FIG. 7.

At 1010, the memory device may execute, at the memory array, a first refresh command of the set of refresh commands according to a first set of refresh parameters. The operations of 1010 may be performed according to the methods described herein. In some examples, aspects of the operations of 1010 may be performed by a refresh mode manager as described with reference to FIG. 7.

At 1015, the memory device may detect a condition of the memory array (e.g., associated with a reduction in data integrity). The operations of 1015 may be performed according to the methods described herein. In some examples, aspects of the operations of 1015 may be performed by an event detector as described with reference to FIG. 7.

At 1020, the memory device may transition, based on detecting the condition, from using the first set of refresh parameters to using a second set of refresh parameters corresponding to an increased refresh rate. The operations of 1020 may be performed according to the methods described herein. In some examples, aspects of the operations of 1020 may be performed by a refresh mode transition manager as described with reference to FIG. 7.

At 1025, the memory device may execute, at the memory array, a second refresh command of the set of refresh commands according to the second set of refresh parameters. The operations of 1025 may be performed according to the methods described herein. In some examples, aspects of the operations of 1025 may be performed by a refresh mode manager as described with reference to FIG. 7.

Some examples of the method 1000 and the apparatus described herein may further include operations, features, means, or instructions for receiving, from a host device, a set of refresh commands for a memory array of a memory device, executing, at the memory array, a first refresh command of the set of refresh commands according to a first set of refresh parameters, detecting, by the memory device, a condition of the memory array associated with a reduction in data integrity, transitioning, based on detecting the condition, from using the first set of refresh parameters to using a second set of refresh parameters corresponding to an increased refresh rate, and executing, at the memory array, a second refresh command of the set of refresh commands according to the second set of refresh parameters.

In some examples of the method 1000 and the apparatus described herein the first set of refresh parameters includes a first quantity of rows of the memory array that may be refreshed during an execution of the first refresh command, and the second set of refresh parameters includes a second quantity of rows of the memory array that may be refreshed during an execution of the second refresh command, where the second quantity of rows may be greater than the first quantity of rows.

In some cases of the method 1000 and the apparatus described herein the condition corresponds to one or more of a temperature condition, a voltage condition, a data error condition, a minimum refresh command rate, or a condition of one or more components of the memory device.

Some instances of the method 1000 and the apparatus described herein may further include operations, features, means, or instructions for transmitting, to the host device and based on determining to transition the memory array from the first set of refresh parameters to the second set of refresh parameters, an indication of the determining to transition the memory array to the second set of refresh parameters.

Some examples of the method 1000 and the apparatus described herein may further include operations, features, means, or instructions for transmitting, to the host device, an indication of the condition detected by the memory device.

Some cases of the method 1000 and the apparatus described herein may further include operations, features, means, or instructions for receiving, from the host device, signaling including an indication to transition the memory array from the second set of refresh parameters to a third set of refresh parameters, and executing, at the memory array, a third refresh command of the set of refresh commands according to the third set of refresh parameters based on signaling received from the host device.

Figure 11:
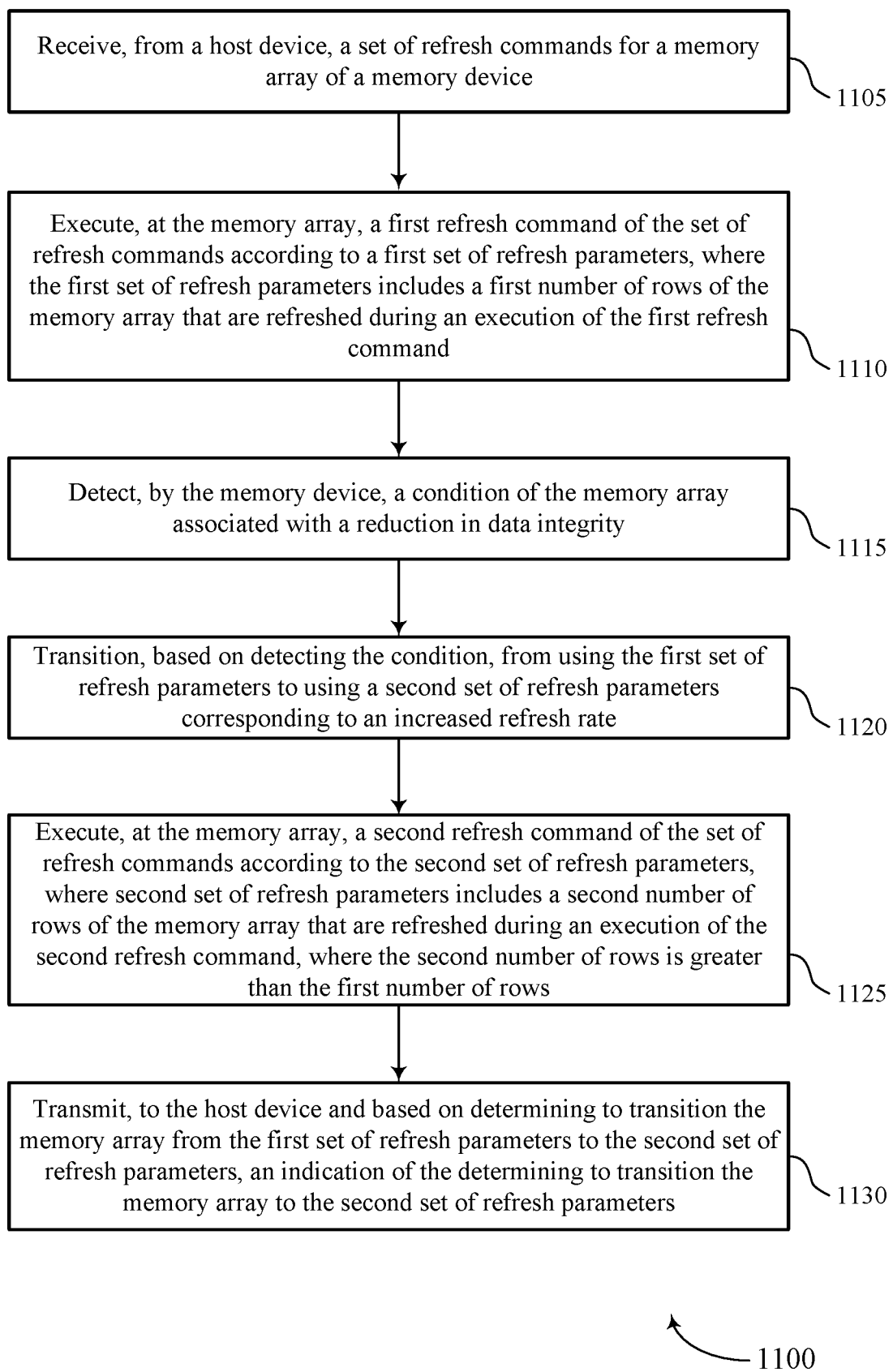

FIG. 11 shows a flowchart illustrating a method 1100 that supports refresh rate control for a memory device as disclosed herein. The operations of method 1100 may be implemented by a memory device (e.g., memory device 110, memory device 310, memory device 510, and memory device 610 as disclosed herein with reference to FIGS. 1, 3, 5, and 6) or its components as described herein. For example, the operations of method 1100 may be performed by a device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1105, the memory device may receive, from a host device, a set of refresh commands for a memory array of a memory device. The operations of 1105 may be performed according to the methods described herein. In some examples, aspects of the operations of 1105 may be performed by a refresh command manager as described with reference to FIG. 7.

At 1110, the memory device may execute, at the memory array, a first refresh command of the set of refresh commands according to a first set of refresh parameters. The first set of refresh parameters may include a first quantity of rows of the memory array that are refreshed during an execution of the first refresh command. The operations of 1110 may be performed according to the methods described herein. In some examples, aspects of the operations of 1110 may be performed by a refresh mode manager as described with reference to FIG. 7.

At 1115, the memory device may detect, by the memory device, a condition of the memory array (e.g., associated with a reduction in data integrity). The operations of 1115 may be performed according to the methods described herein. In some examples, aspects of the operations of 1115 may be performed by an event detector as described with reference to FIG. 7.

At 1120, the memory device may transition, based on detecting the condition, from using the first set of refresh parameters to using a second set of refresh parameters corresponding to an increased refresh rate. The operations of 1120 may be performed according to the methods described herein. In some examples, aspects of the operations of 1120 may be performed by a refresh mode transition manager as described with reference to FIG. 7.

At 1125, the memory device may execute, at the memory array, a second refresh command of the set of refresh commands according to the second set of refresh parameters. The second set of refresh parameters may include a second quantity of rows of the memory array that are refreshed during an execution of the second refresh command, where the second quantity of rows is greater than the first quantity of rows. The operations of 1125 may be performed according to the methods described herein. In some examples, aspects of the operations of 1125 may be performed by a refresh mode manager as described with reference to FIG. 7.

At 1130, the memory device may transmit, to the host device and based on determining to transition the memory array from the first set of refresh parameters to the second set of refresh parameters, an indication of the determining to transition the memory array to the second set of refresh parameters. The operations of 1140 may be performed according to the methods described herein. In some examples, aspects of the operations of 1140 may be performed by an indication transmitter as described with reference to FIG. 7.

It should be noted that the methods described herein describe possible implementations, and that the operations and the steps may be rearranged or otherwise modified and that other implementations are possible. Further, aspects from two or more of the methods may be combined.

In some examples, an apparatus configured for refresh rate control for a memory device may perform aspects of the function described herein using general- or special-purpose hardware. The apparatus may include a processor, memory in electronic communication with the processor, and instructions stored in the memory. The instructions may be executable by the processor to cause the apparatus to a memory array having a set of rows of memory cells, a memory interface coupled with the memory array and configured to periodically receive, from a host, a set of commands for refreshing rows of the memory array, circuitry coupled with the memory array and the memory interface, the circuitry operable to cause the apparatus to identify a target rate for refreshing the memory array based on a detected event (e.g., an event associated with a reduction in data integrity at the memory array), determine that a rate associated with the set of commands for refreshing the memory array does not satisfy the target rate, and adjust one or more parameters related to refreshing the rows of memory cells during an execution of a command of the set of commands for refreshing the rows of the memory array to satisfy the target rate.

In some cases, the detected event corresponds to one or more of a temperature event, a determined voltage condition, an error event, a minimum rate for refreshing the memory array, and a status of one or more components of the apparatus.

In some examples, the memory interface may be further configured to transmit, to the host and based on the determining that the rate does not satisfy the target rate, signaling that indicates the adapting of the one or more parameters.

In some instances, the memory interface may be further configured to transmit the signaling that indicates the detected event at the memory array.

Although certain features may be described herein with respect to or in the context of DRAM technology, this is for illustrative purposes only, and one of ordinary skill in the art will appreciate that the teachings herein may be applied to any type of memory device. For example, the teachings herein may be applied to volatile or non-volatile memory devices such as magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, any combination thereof, or the like. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the industry standard or specification, the description may be applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, any combination thereof, or the like.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or the like, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or the like, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or the like, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
  operating a memory array of a memory device according to a first set of refresh parameters corresponding to a first rate for refreshing the memory array;
  detecting, by the memory device, an event corresponding to at least one of a voltage condition, a data error condition, a minimum refresh rate, or a status associated with a decreased data integrity of one or more components of the memory array;
  operating the memory array according to a second set of refresh parameters based at least in part on detecting the event, the second set of refresh parameters corresponding to a second rate for refreshing the memory array that is faster than the first rate; and
  transmitting, to a host device based at least in part on detecting the event at the memory array, signaling comprising an indication of operating the memory array according to the second set of refresh parameters.

2. The method of claim 1, further comprising:
switching, by the memory device, from operating according to the first set of refresh parameters to operating according to the second set of refresh parameters based at least in part on detecting the event at the memory device.

3. The method of claim 1, further comprising:
determining, by the memory device, that a temperature of the memory device satisfies a threshold, wherein detecting the event at the memory array is based at least in part on determining that the temperature of the memory device satisfies the threshold.

4. The method of claim 1, wherein:
the first set of refresh parameters comprise a first quantity of rows that are refreshed for each of a plurality of refresh operations; and
the second set of refresh parameters comprise a second quantity of rows that are refreshed for each of the plurality of refresh operations.

5. The method of claim 4, further comprising:
determining, by the memory device, the first quantity of rows and a first refresh periodicity, wherein operating the memory array according to the first set of refresh parameters comprises performing the plurality of refresh operations at the first refresh periodicity; and
determining, by the memory device and based at least in part on detecting the event at the memory array, the second quantity of rows and a second refresh periodicity, wherein operating the memory array according to the second set of refresh parameters comprises performing the plurality of refresh operations at the second refresh periodicity.

6. The method of claim 4, further comprising:
receiving, from the host device, a plurality of refresh commands, wherein operating the memory array according to the first set of refresh parameters or the second set of refresh parameters comprises performing one of the plurality of refresh operations for each of the plurality of refresh commands.

7. The method of claim 1, wherein the event corresponds to the data error condition, and wherein the data error condition is based at least in part on a rate of error corrections for a circuit initiating error correction on data stored in the memory array.

8. The method of claim 1, wherein the signaling comprises one or more bits indicative of the event.

9. The method of claim 1, further comprising:
receiving, from the host device while operating the memory array according to the second set of refresh parameters, an indication to operate the memory array according to a third set of refresh parameters; and
operating the memory array according to the third set of refresh parameters based at least in part on receiving the indication from the host device.

10. A method, comprising:
receiving, from a host device, a plurality of refresh commands for a memory array of a memory device;
executing, at the memory array, a first refresh command of the plurality of refresh commands according to a first set of refresh parameters;
detecting, by the memory device, a condition of the memory array;
transitioning, based at least in part on detecting the condition, from using the first set of refresh parameters to using a second set of refresh parameters corresponding to an increased refresh rate;
executing, at the memory array, a second refresh command of the plurality of refresh commands according to the second set of refresh parameters; and
transmitting, to the host device and based at least in part on determining to transition the memory array from the first set of refresh parameters to the second set of refresh parameters, an indication of the determining to transition the memory array to the second set of refresh parameters.

11. The method of claim 10, wherein:
the first set of refresh parameters comprises a first quantity of rows of the memory array that are refreshed during an execution of the first refresh command; and
the second set of refresh parameters comprises a second quantity of rows of the memory array that are refreshed during an execution of the second refresh command, wherein the second quantity of rows is greater than the first quantity of rows.

12. The method of claim 10, wherein the condition corresponds to one or more of a temperature condition, a voltage condition, a data error condition, a minimum refresh command rate, or a condition associated with a decreased data integrity of one or more components of the memory device.

13. The method of claim 10, further comprising:
transmitting, to the host device, an indication of the condition detected by the memory device.

14. The method of claim 10, further comprising:
receiving, from the host device, signaling comprising an indication to transition the memory array from the second set of refresh parameters to a third set of refresh parameters; and
executing, at the memory array, a third refresh command of the plurality of refresh commands according to the third set of refresh parameters based at least in part on signaling received from the host device.

* * * * *